(12) United States Patent
Thomas et al.

(10) Patent No.: US 8,902,956 B2
(45) Date of Patent: Dec. 2, 2014

(54) ON-PACKAGE INPUT/OUTPUT CLUSTERED INTERFACE HAVING FULL AND HALF-DUPLEX MODES

(75) Inventors: Thomas P. Thomas, Beaverton, OR (US); Stanley S. Kulick, Portland, OR (US); Randy B. Osborne, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/995,015

(22) PCT Filed: Dec. 22, 2011

(86) PCT No.: PCT/US2011/066981
§ 371 (c)(1),
(2), (4) Date: Jun. 17, 2013

(87) PCT Pub. No.: WO2013/095542
PCT Pub. Date: Jun. 27, 2013

(65) Prior Publication Data
US 2013/0322556 A1    Dec. 5, 2013

(51) Int. Cl.
| | | |
|---|---|---|
| H04B 1/38 | (2006.01) | |
| H04B 3/02 | (2006.01) | |
| G06F 15/78 | (2006.01) | |
| G06F 13/40 | (2006.01) | |
| H03K 19/0175 | (2006.01) | |

(52) U.S. Cl.
CPC .............. *G06F 13/4068* (2013.01); *H04B 3/02* (2013.01); *G06F 15/7825* (2013.01); *G06F 13/4086* (2013.01); *H03K 19/017545* (2013.01); *G04B 14/023* (2013.01); *G04B 1/40* (2013.01)

USPC ........... 375/219; 375/257; 375/295; 375/316; 710/105; 710/305

(58) Field of Classification Search
CPC ............ G06F 13/4068; G06F 13/4086; G06F 15/7825; H03K 19/017545; H04B 14/023; H04B 1/40; H04B 3/02
USPC ........... 375/257, 219, 295, 316; 710/305, 105
See application file for complete search history.

(56) References Cited

U.S. PATENT DOCUMENTS

| | | |
|---|---|---|
| 5,963,746 A | 10/1999 | Barker et al. |
| 6,944,691 B1 | 9/2005 | Li et al. |

(Continued)

OTHER PUBLICATIONS

International Search Report and Written Opinion for PCT/US2011/066981 mailed Sep. 25, 2012, 10 pages.

(Continued)

*Primary Examiner* — Kenneth Lam
(74) *Attorney, Agent, or Firm* — Blakely, Sokoloff, Taylor & Zafman LLP (57) ABSTRACT

An apparatus and system for controlling traffic on an on-chip network. Embodiments of the apparatus comprise single-ended transmission circuitry and single-ended receiving circuitry on a first chip for coupling with a second chip, the transmission circuitry having impedance matching and lacking equalization, the receiving circuitry lacking equalization, the transmission circuitry and the receiving circuitry having statically configurable features and organized in clusters, wherein the clusters have the same physical layer circuitry design for different configurations of the configurable features, the configurable features including half-duplex mode and full-duplex mode, wherein the first chip and the second chip are on the same package, and wherein a plurality of conductive lines for coupling the first chip with the second chip are matched.

20 Claims, 6 Drawing Sheets

(56) References Cited

U.S. PATENT DOCUMENTS

| | | | |
|---|---|---|---|
| 7,017,140 B2 | 3/2006 | Haji-Aghajani et al. | |
| 7,461,188 B2* | 12/2008 | Greeff et al. | 710/100 |
| 2008/0034378 A1* | 2/2008 | Kumar et al. | 719/321 |
| 2010/0159829 A1* | 6/2010 | McCormack | 455/41.1 |
| 2011/0057302 A1 | 3/2011 | Spehar et al. | |
| 2013/0300475 A1* | 11/2013 | Kurd et al. | 327/158 |
| 2013/0313709 A1* | 11/2013 | Hinck et al. | 257/738 |
| 2014/0009195 A1* | 1/2014 | Osborne et al. | 327/158 |
| 2014/0085791 A1* | 3/2014 | Hinck | 361/679.3 |
| 2014/0204490 A1* | 7/2014 | Mellinger et al. | 361/56 |

OTHER PUBLICATIONS

International Preliminary Report on Patentability for PCT/US2011/066981 mailed Jul. 3, 2014, 5 pages.

* cited by examiner

ON-PACKAGE INPUT/OUTPUT CLUSTERED INTERFACE HAVING FULL AND HALF-DUPLEX MODES

FIELD OF THE INVENTION

Embodiments of the invention relate to input/output architectures and interfaces. More particularly, embodiments of the invention relate to high-bandwidth on-package input/output architectures and interfaces.

BACKGROUND

High bandwidth interconnections between chips using conventional input/output (I/O) interfaces require significant power and chip area. Thus, in applications requiring significantly reduced power consumption and/or smaller chip area, these conventional I/O interfaces are not desirable.

Conventional I/O interfaces have limited configurability and scalability due, at least in part, to their significant power and chip area requirements.

Conventional I/O interfaces have physical layers that are designed and customized according to the requirements of the interface. Thus, conventional I/O interfaces having different configurations require different physical layer designs. Significant time and effort is required to customize the physical layer design for each different interface.

BRIEF DESCRIPTION OF THE DRAWINGS

The embodiments of the invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Clustered on-package I/O (OPIO) may be used to provide a customizable interface for coupling a chip with one or more other chips without requiring custom designed physical layers for interfaces having different configurations of features. For example, OPIO may be used to couple a processor with another processor on the same package or a processor with a memory chip. Other examples include using a scalable clustered OPIO interface to couple a CPU with cache or other non-memory chips of different types. The coupled chips and OPIO interface could be, for example, in a multi-chip package (MCP) or in 3D stacked configurations.

OPIO circuitry may be organized into scalable clusters, each using the same physical layer design, to satisfy different interfacing requirements. In one embodiment, a cluster is a group of data transmitters or receivers sharing a forwarded clock signal. In one embodiment, configurable interface features include one or more of: bandwidth, full and half-duplex modes, frequency, level of serialization of data, 2-level pulse amplitude modulation (2-PAM) and 4-level pulse amplitude modulation (4-PAM), and a symmetric or asymmetric transmitting and receiving bandwidth. In one embodiment, the wide range of flexibility in using the same OPIO clusters for different interfaces is due, at least in part, to the short distance between the coupled chips. In one embodiment, the flexibility is due, at least in part, to the receiving circuitry having programmable termination, which may be disabled or enabled (as weak or fully matched termination) as the distance and/or data rate between chips increase, enabling configurations requiring different distance between chips, bandwidths, and power usage.

In one embodiment, the same physical layer design for each cluster is used for OPIO interfaces having different interfacing requirements, enabling reuse of OPIO clusters for different chip interfaces. The use of OPIO clusters can, for example, eliminate the time, effort, and expense associated with custom designed interfaces. For example, the same physical layer design is usable for an interface requiring half-duplex mode and for an interface requiring full-duplex mode.

Figure 1:
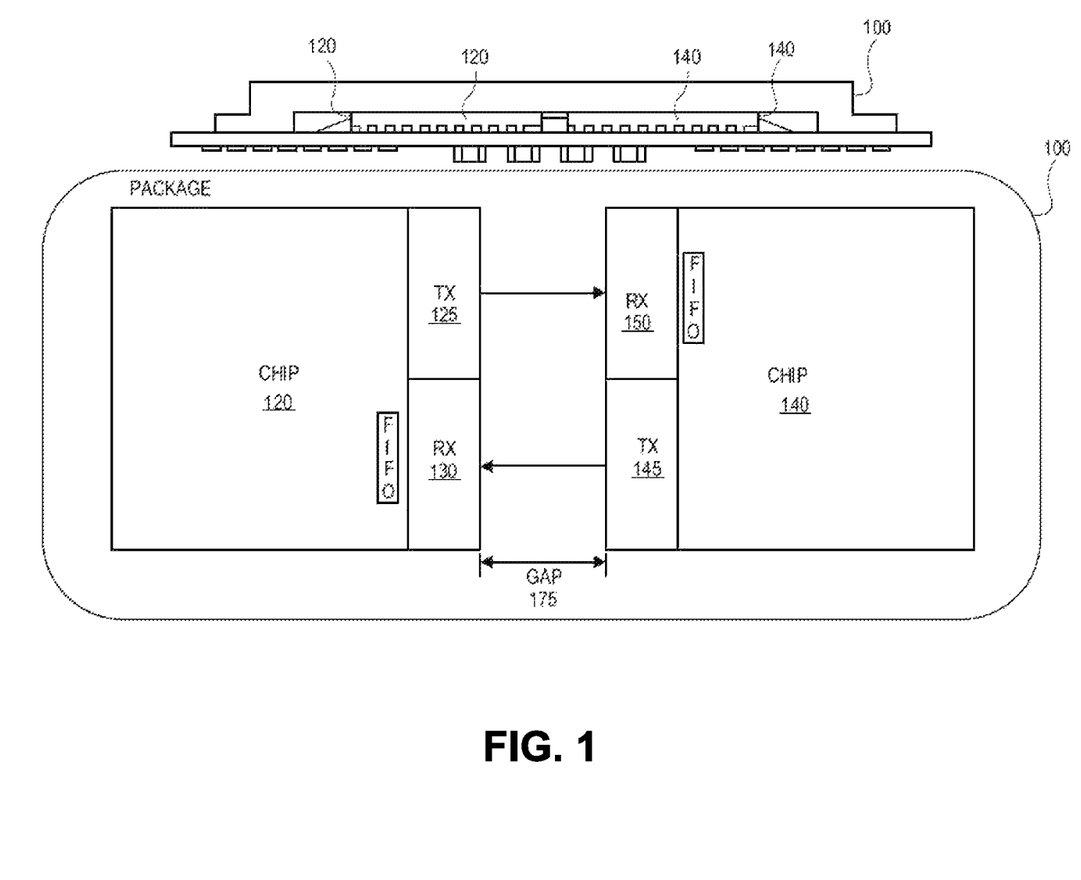
FIG. 1 is a block diagram of one embodiment of a multi-chip package (MCP) having on-package input/output (OPIO) interfaces between at least two chips.

FIG. 1 is a block diagram of one embodiment of a multi-chip package (MCP) having on-package input/output (OPIO) interfaces between at least two chips. The example of FIG. 1 illustrates two chips with interfaces; however, any number of chips within a package can be interconnected using the techniques described herein.

Package 100 may be any type of package that may contain multiple integrated circuit chips. In the example of FIG. 1, package 100 contains chip 120 and chip 140. These chips may be, for example, processors, memory chips (e.g., eDRAM, DRAM, stacked DRAM, Flash, PCM, etc.), graphics processors, etc.

In one embodiment, chip 120 includes OPIO transmitters 125 and OPIO receivers 130. Similarly, chip 140 includes OPIO transmitters 145 and OPIO receivers 150. Transmitters 125 are coupled with receivers 150 and transmitters 145 are coupled with receivers 130. As will be described in the following sections of this application with respect to FIGS. 2-4, transmitting circuitry and receiving circuitry may be organized into scalable clusters. For example, in one embodiment, OPIO transmitters 125 and receivers 130 and OPIO transmitters 145 and receivers 150 are organized as scalable clusters (not shown in FIG. 1).

In one embodiment, gap 175 between chip 120 and chip 140 is relatively small. In one embodiment, gap 175 is less than 20 mm. In one embodiment, gap 175 is less than 10 mm. In one embodiment, gap 175 is approximately 1.5 mm. In other embodiments, gap 175 may be less than 1.5 mm. In general, the smaller gap 175, the greater the bandwidth that may be provided between chips.

In one embodiment, the interfaces between transmitter 125 and receiver 150, and between transmitter 145 and receiver 130 are single-ended, relatively high-speed interfaces. In one embodiment, the interfaces are CMOS interfaces between chip 120 and chip 140. In one embodiment, transmitters 125 and 145 are impedance matched CMOS transmitters and no termination or equalization is provided. In one embodiment, transmitters 125 and 145 are impedance matched CMOS transmitters and very weak termination and no equalization is provided.

In one embodiment, a forwarded clock signal is transmitted for a cluster of signals. The forwarded clock signal may or may not be differential. In one embodiment, length-matched routing is provided between the transmitters and the receivers. In one embodiment, minimal electrostatic discharge (ESD) protection (as little as 70 Volts) is provided for the interfaces between chips 120 and 140.

In one embodiment, use of a CMOS transmitter and receiver with no or weak receiver termination and no equalization can reduce I/O power. Simplified clocking with forwarded clock per cluster of signals and no per pin de-skew can be achieved due to careful length matched routing reduces clock power. Thus, the architectures described herein provide high bandwidth between chips at very low power, area, and latency.

The architectures described herein can also be extended to close discrete packages with full ESD protection for small form factor mobile applications at lower data rates. Multi-level (e.g., M-PAM) signaling can be used at higher data rates to keep the clock frequency down.

Figure 2:
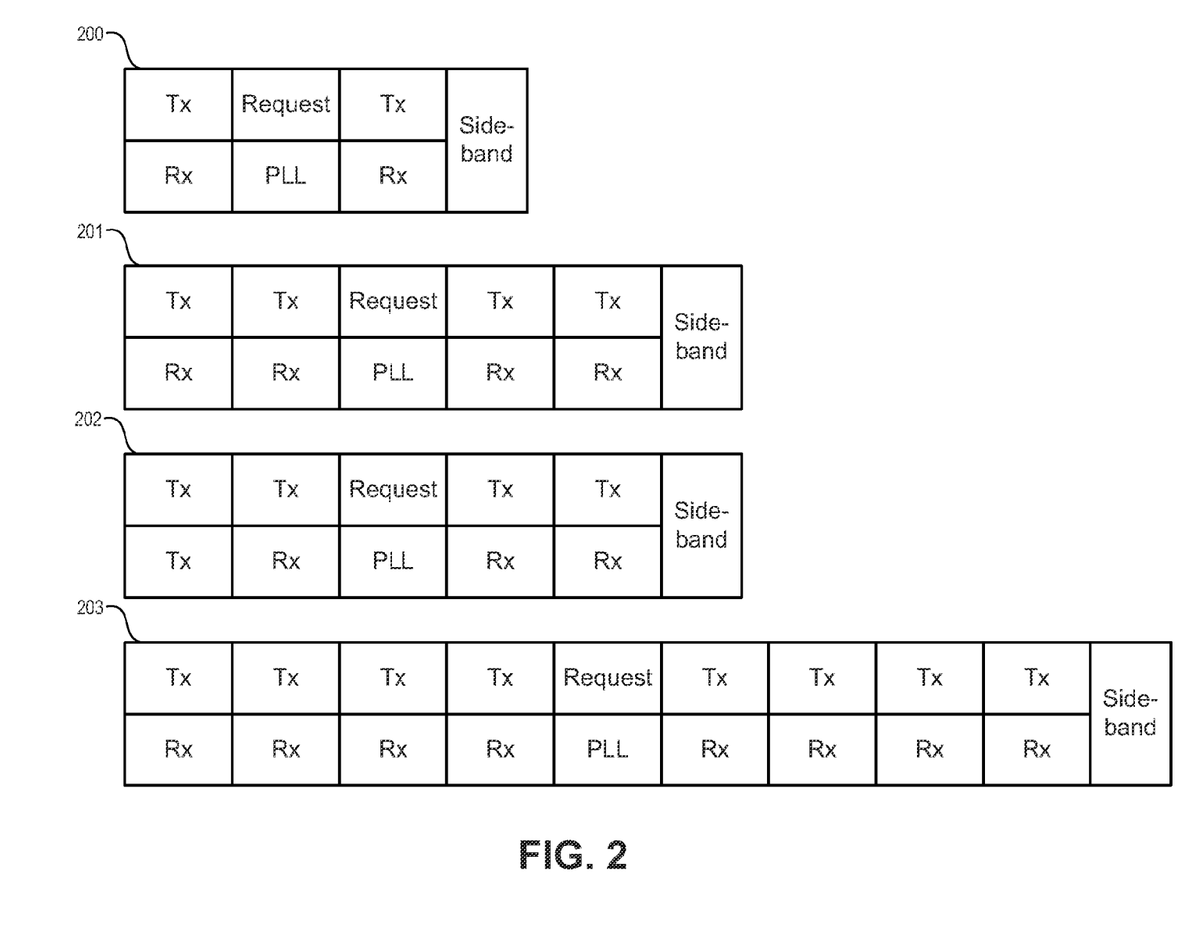
FIG. 2 is a block diagram of embodiments of transmission and receiving circuitry organized as clusters for master-slave OPIO interface configurations.

FIG. 2 is a block diagram of embodiments of transmission and receiving circuitry organized as clusters for a master-slave OPIO interface configuration. A master-slave interface configuration may be used, for example, for coupling a processor with memory.

Each of the configurations 200-203 include boxes representing clusters of circuitry. For example, configuration 200 includes four data clusters labeled "Tx" (transmission clusters) or "Rx" (receiving clusters), a request cluster labeled "Request," a sideband cluster labeled "Sideband," and a clock generator labeled "PLL."

In one embodiment, clustered OPIO interfaces are configurable in a variety of ways for coupling different chips having different interfacing requirements, and the same physical layer design may be used for each of the different interfaces. For example, clustered OPIO interfaces may couple chips requiring different protocols (e.g., memory and non-memory protocols, master-slave and peer-to-peer protocols), have configurable bandwidth, full and half-duplex modes, frequency, levels of serialization, levels of pulse amplitude modulation (e.g., 2-PAM or 4-PAM), have a symmetric or asymmetric number of transmission and receiving clusters, etc. In one embodiment, the interfaces are dynamically configurable at boot-time or run-time of the chips. Dynamic configuration of one or more of the interface features may be accomplished, for example, via control registers and sideband signaling.

The data clusters of configuration 200-203 are separated into transmission clusters (labeled "Tx") and receiving clusters (labeled "Rx"), illustrating embodiments for operation in full-duplex mode. In full-duplex mode, some of the conductive lines coupling two or more chips are dedicated to transmission and some of the lines are dedicated to receiving, permitting transmission and receiving of data to occur simultaneously.

In one embodiment, the receiving and transmission circuitry is organized in N clusters, each of the N clusters comprising M data bits, wherein N and M are configurable to dynamically change a bandwidth of an interface between the chips. In one embodiment, the number of data clusters (N) and the number of data bits in each data cluster (M) may be configured statically for fine granularity bandwidth scaling, using the same physical layer design for each of the N data clusters.

Each of the configurations 200-203 includes a single request cluster, which includes, for example, circuitry for communicating command and address information. One or more request clusters may be used for memory applications. For example, interfacing circuitry between a chip including a processor and a chip including memory may include a request cluster.

In some embodiments, each data cluster may include one or more ECC bits, one or more forwarded clock signals, and/or one or more valid bits. In one such embodiment, the one or more ECC bits are used for error detection and correction. In one embodiment, one or more valid bits are used to indicate the validity of transmitted data.

Data (with or without ECC bits, valid bits, or other overhead or control bits), command bits, and address bits may be serialized and/or packetized. In one embodiment, such serialization minimizes the number of connecting wires e.g., C4 bumps with on-package traces or Through Silicon Vias (TSVs)) and/or silicon area. The degree of serialization or de-serialization can be changed depending on the application (e.g, 4:1:4 for MCP and 2:1:2 for TSV, which may have higher I/O density).

In one embodiment, an OPIO clustered interface can be operated in full duplex mode with equal or unequal number of Tx and Rx clusters. Configurations 200, 201, and 203 illustrate full duplex modes with an equal number of Tx and Rx clusters (i.e., symmetric Tx and Rx). Configuration 202 illustrates an unequal number of Tx and Rx clusters (i.e., asymmetric Tx and Rx). Asymmetric bandwidth for transmission and receiving may improve performance in some interfaces or for some applications or traffic patterns.

In one embodiment, a side-band cluster is used for "handshake" signals and other low speed signal(s). Handshake signals are used, for example, in an initialization process to establish communication and/or determine an interface configuration, state and/or readiness.

In one embodiment, the data rate of the OPIO interface is fully scalable over a wide range. For example, data rates may be scalable from 0-24 GT/s. At very low frequencies, the DLL may be set to have a maximum delay.

In one embodiment, multiple memory devices (e.g., stacked DRAM or NVM) may be coupled to the same OPIO link. In one such embodiment, a logic chip (not shown) can be used to combine multiple lower bandwidth connections (e.g., Through Silicon Via (TSV) using wide I/O) into a single high bandwidth OPIO interface. In another embodiment, an additional logic chip may not be required by stacking a DRAM or NVM chip directly on top of processor and using an OPIO interface for the TSV connection (instead of, e.g., wide I/O) for higher bandwidth.

Figure 3:
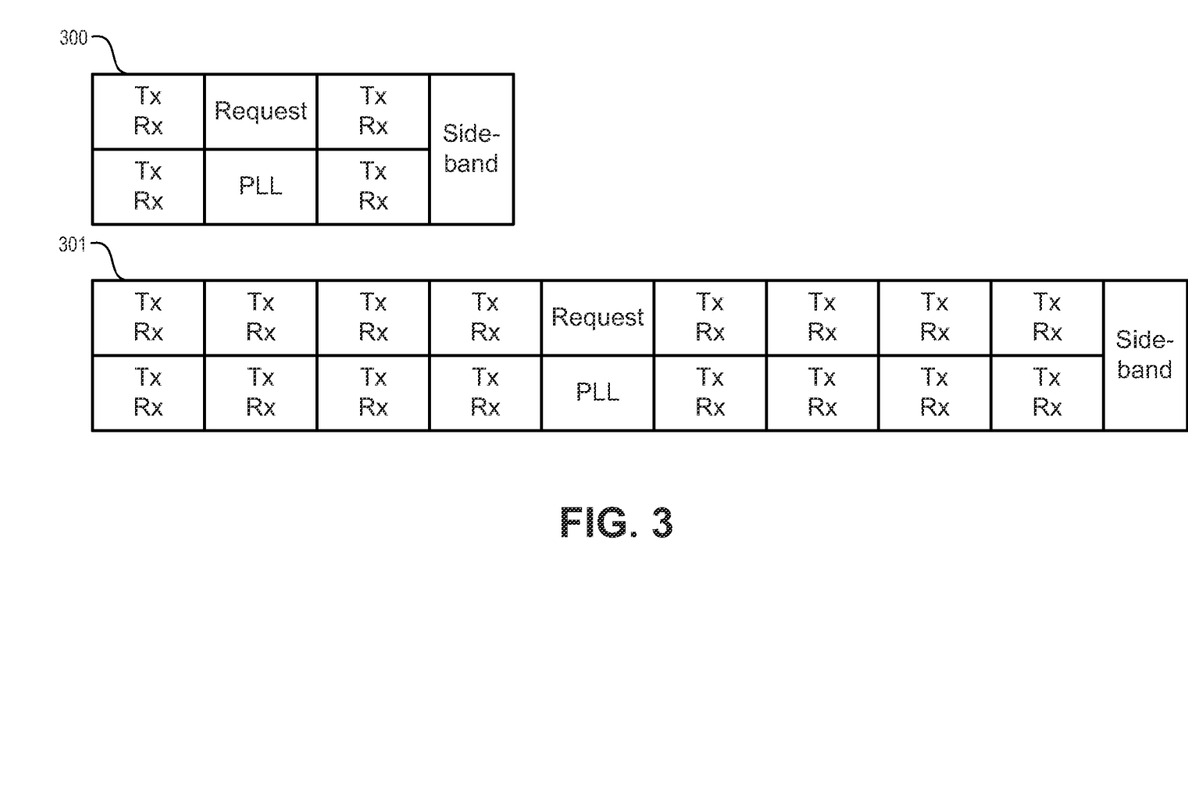
FIG. 3 is another block diagram of embodiments of transmission and receiving circuitry organized as clusters for master-slave OPIO interface configurations.

FIG. 3 is another block diagram of embodiments of transmission and receiving circuitry organized as clusters for master-slave OPIO interface configurations. Configurations 300 and 301 illustrate half-duplex mode with data clusters that include transceivers (e.g., circuitry for both transmission and receiving connected to the same input/output pad). In half-duplex mode, the same conductive lines are used for both transmission and receiving. In one embodiment, half-duplex mode with bus turn-around may be used for interfaces or applications in which simultaneous bandwidth in each direction is not required and/or maximum bandwidth utilization in either direction is required for a given number of conductive lines. For a half duplex configuration, the amount of time spent in each direction affects the bandwidth.

In one embodiment, clustered OPIO interface circuitry is configurable statically to support full-duplex mode or half-duplex mode using the same physical layer design. In another embodiment, full-duplex mode or half-duplex mode may be dynamically configured (e.g., during the boot or runtime of the chips).

Figure 4:
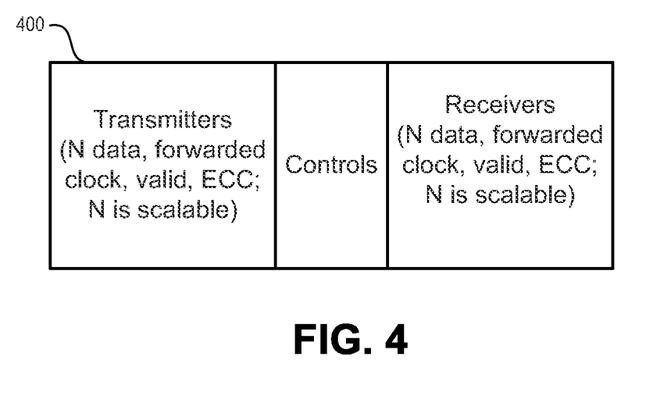
FIG. 4 is a block diagram of embodiments of transmission and receiving circuitry organized as clusters for peer-to-peer (P2P) OPIO interface configurations.

FIG. 4 is a block diagram of embodiments of transmission and receiving circuitry organized as clusters for peer-to-peer (P2P) OPIO interface configurations (e.g., for interfaces coupling a processor with another processor or a chipset). Configuration 400 includes two data clusters comprising transmitters and receivers, as well as a control cluster. The control cluster may include, for example, handshake controls for initializing two or more coupled chips. As described above, the clusters may be statically or dynamically configured, and the different interface configurations use the same physical layer circuitry design.

Figure 5:
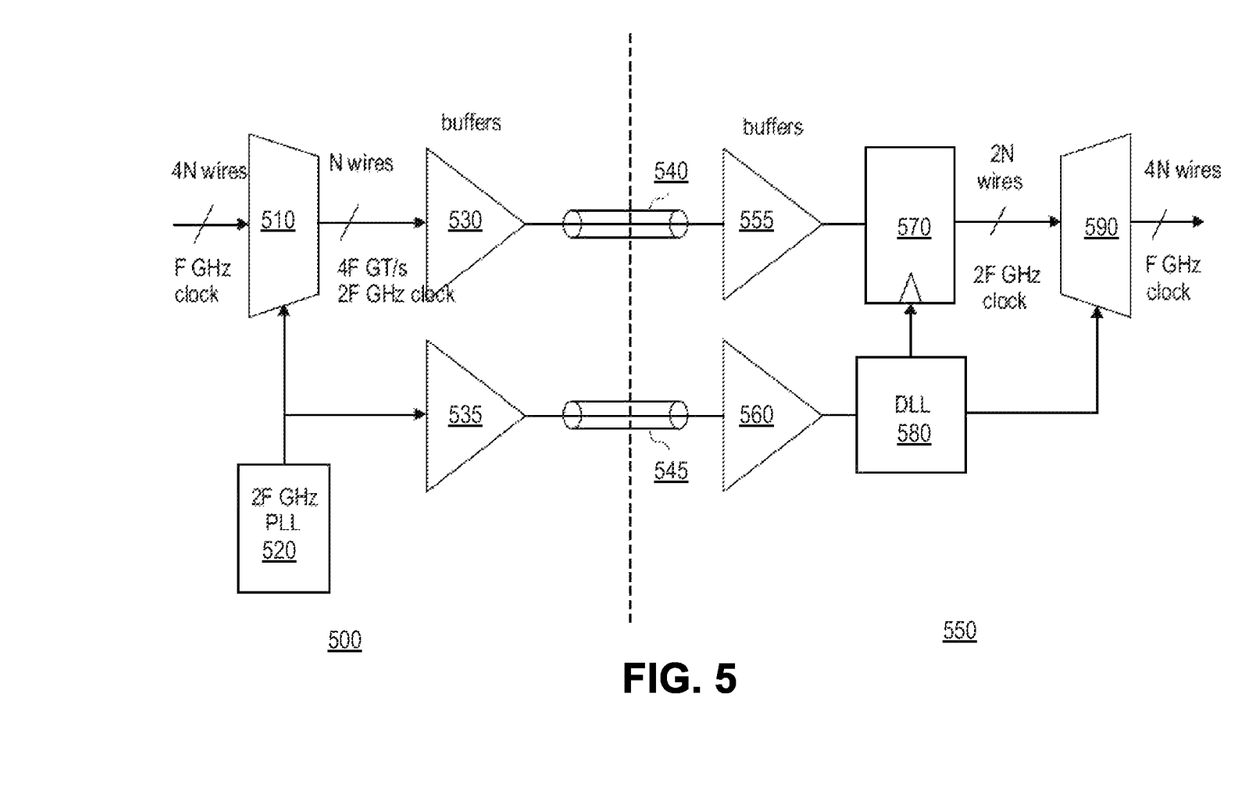
FIG. 5 is a diagram of one embodiment of a physical layer interface.

FIG. 5 is a diagram of one embodiment of a physical layer interface. The physical layer interface of FIG. 5 may provide the interfaces described above with respect to FIG. 1. Chip 500 and chip 550 reside in a single package and are physically positioned with a relatively small gap between them, as described above.

The example of FIG. 5 provides transmission from chip 500 to chip 550. A similar physical layer interface may be used to transmit from chip 550 to chip 500. The example of FIG. 5 provides a 4:1 multiplexing mechanism, which is optional and may be eliminated for certain embodiments or other multiplexing ratios may be supported based on, for example, transmission speeds compared to internal clock signals, etc.

In one embodiment, multiplexor 510 receives as input signals from 4N lines and a clock signal at F GHz. In one embodiment, multiplexor 510 is driven by a clock signal from 2F GHz phase locked loop (PLL) 520.

In one embodiment, the signal from 2F GHz PLL 520 is also provided to buffer 535 to be transmitted to chip 550 over transmission line 545. In one embodiment, only one such forwarded clock signal is sent per cluster of N data signals, where N can be one or more bits (N=1, 8, 16, 32 data bits, for example). Multiplexor 510 multiplexes the 4N signals to N lines to be provided to buffer(s) 530 for transmission to chip 550 over transmission line(s) 540.

Buffer 560 on chip 550 receives the 2F GHz clock signal from transmission line 545. Similarly, buffer(s) 555 receive the signals from N lines over transmission line(s) 540. In one embodiment, the 2F GHz signal from buffer 560 drives a digital or analog Delay Locked Loop (DLL) 580, which in turn drives sampler 570.

Sampler 570 latches the signals from N lines received from buffer 555 to 2N lines with a 2F GHz clock signal using both edges of the clock, which are sent to demultiplexor 590, also driven by DLL 580. Demultiplexor 590 recovers the signals from the 4N lines and the F GHz clock signal originally received by multiplexor 510 on chip 500. Thus, the signals from the 4N lines may be transmitted from chip 500 to chip 550 over transmission lines 540 and 545.

Figure 6:
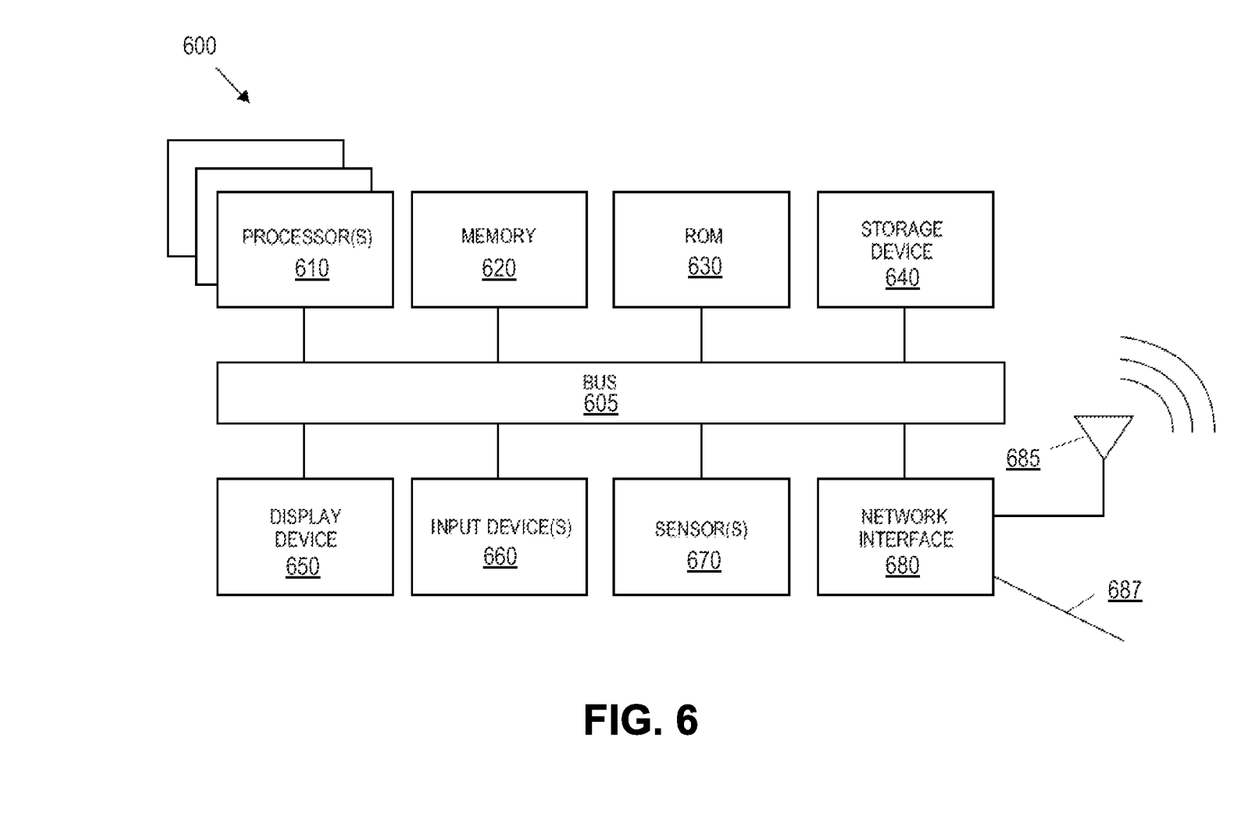
FIG. 6 is a block diagram of one embodiment of an electronic system.

FIG. 6 is a block diagram of one embodiment of an electronic system. The electronic system illustrated in FIG. 6 is intended to represent a range of electronic systems (either wired or wireless) including, for example, a tablet device, a smartphone, a desktop computer system, a laptop computer system, a server, etc. Alternative electronic systems may include more, fewer and/or different components.

One or more of the components illustrated in FIG. 6 may be interconnected utilizing the OPIO architectures described herein. For example, multiple processor chips may be interconnected, or a processor and a cache memory or dynamic random access memory, etc.

Electronic system 600 includes bus 605 or other communication device to communicate information, and processor(s) 610 coupled to bus 605 that may process information. Electronic system 600 may include multiple processors and/or co-processors. Electronic system 600 further may include random access memory (RAM) or other dynamic storage device 620 (referred to as memory), coupled to bus 605 and may store information and instructions that may be executed by processor(s) 610. Memory 620 may also be used to store temporary variables or other intermediate information during execution of instructions by processor(s) 610.

Electronic system 600 may also include read only memory (ROM) and/or other static storage device 630 coupled to bus 605 that may store static information and instructions for processor(s) 610. Data storage device 640 may be coupled to bus 605 to store information and instructions. Data storage device 640 such as a magnetic disk or optical disc and corresponding drive may be coupled to electronic system 600.

Electronic system 600 may also be coupled via bus 605 to display device 650, which can be any type of display device, to display information to a user, for example, a touch screen. Input device 660 may be any type of interface and/or device to allow a user to provide input to electronic system 600. Input device may include hard buttons and/or soft buttons, voice or speaker input, to communicate information and command selections to processor(s) 610.

Electronic system 600 may further include sensors 670 that may be used to support functionality provided by Electronic system 600. Sensors 670 may include, for example, a gyroscope, a proximity sensor, a light sensor, etc. Any number of sensors and sensor types may be supported.

Electronic system 600 further may include network interface(s) 680 to provide access to a network, such as a local area network. Network interface(s) 680 may include, for example, a wireless network interface having antenna 685, which may represent one or more antenna(e). Network interface(s) 680 may also include, for example, a wired network interface to communicate with remote devices via network cable 687, which may be, for example, an Ethernet cable, a coaxial cable, a fiber optic cable, a serial cable, or a parallel cable.

In one embodiment, network interface(s) 680 may provide access to a local area network, for example, by conforming to IEEE 802.11b and/or IEEE 802.11g and/or IEEE 802.11n standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Associated as well as previous or subsequent versions of the Bluetooth standard may also be supported.

In addition to, or instead of, communication via wireless LAN standards, network interface(s) 680 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

We claim:

1. An apparatus comprising:
single-ended transmission circuitry and single-ended receiving circuitry on a first chip for coupling with a second chip, the transmission circuitry having impedance matching and lacking equalization, the receiving circuitry lacking equalization, the transmission circuitry and the receiving circuitry having statically configurable features and organized in clusters, wherein the clusters have the same physical layer circuitry design for different configurations of the configurable features, the configurable features including half-duplex mode and full-duplex mode, wherein the first chip and the second chip are on the same package, and wherein a plurality of conductive lines for coupling the first chip with the second chip are matched.

2. The apparatus of claim 1, wherein the configurable features are dynamically configurable during runtime of the first chip and the second chip.

3. The apparatus of claim 2, wherein the configurable features further comprise a bandwidth of an interface between the first chip and the second chip, wherein the bandwidth is configurable by configuring the number of the clusters and a number of data bits in each of the clusters.

4. The apparatus of claim 2, wherein the configurable features further comprise an ECC bit for error detection and correction and a valid bit for indicating data is valid in each of the clusters.

5. The apparatus of claim 2, wherein the configurable features further comprise symmetric and asymmetric receiving and transmission bandwidth.

6. The apparatus of claim 2, wherein the configurable features further comprise 2-level pulse amplitude modulation (2-PAM) and 4-level pulse amplitude modulation (4-PAM).

7. The apparatus of claim 2, wherein each of the clusters further comprises a forwarded clock signal, and wherein the configurable features further comprise a frequency of the forwarded clock signal.

8. The apparatus of claim 7, wherein the configurable features further comprise a single-ended or differential characteristic of the forwarded clock signal.

9. The apparatus of claim 2, wherein the configurable features further comprise a degree of serialization of data.

10. The apparatus of claim 2, wherein the receiving circuitry has programmable termination.

11. The apparatus of claim 2, further comprising:
circuitry, organized as a cluster, for initializing the interface via side-band signals.

12. The apparatus of claim 2, wherein the configurable features comprises protocols for communication between the first chip and the second chip including a master-slave protocol and a peer-to-peer protocol.

13. The apparatus of claim 12, further comprising circuitry, organized as a cluster, for communicating at least one of commands, control information, and requests for the master-slave protocol.

14. A system comprising:
an omnidirectional antenna; and
single-ended transmission circuitry and single-ended receiving circuitry on a first chip for coupling with a second chip, the transmission circuitry having impedance matching and lacking equalization, the receiving circuitry lacking equalization,
the transmission circuitry and the receiving circuitry having statically configurable features and organized in clusters, wherein the clusters have the same physical layer circuitry design for different configurations of the configurable features, the configurable features including half-duplex mode and full-duplex mode, wherein the first chip and the second chip are on the same package, and wherein a plurality of conductive lines for coupling the first chip with the second chip are matched.

15. The system of claim 14, wherein the configurable features are dynamically configurable during runtime of the first chip and the second chip.

16. The system of claim 15, wherein the configurable features further comprise a bandwidth of an interface between the first chip and the second chip, wherein the bandwidth is configurable by configuring the number of the clusters and a number of data bits in each of the clusters.

17. The system of claim 15, wherein each of the clusters further comprises a forwarded clock signal, and wherein the configurable features further comprise:
a frequency of the forwarded clock signal;
a single-ended or differential characteristic of the forwarded clock signal;
an ECC bit for error detection and correction and a valid bit for indicating data is valid in each of the clusters;
symmetric and asymmetric receiving and transmission bandwidth;
2-level pulse amplitude modulation (2-PAM) and 4-level pulse amplitude modulation (4-PAM);
a degree of serialization of data; and
protocols for communication between the first chip and the second chip including a master-slave protocol and a peer-to-peer protocol.

18. The system of claim 14, wherein the receiving circuitry has programmable termination.

19. The system of claim 14, further comprising:
circuitry, organized as a cluster, for initializing the interface via side-band signals.

20. The system of claim 14, further comprising circuitry, organized as a cluster, for communicating at least one of commands, control information, and requests for the master-slave protocol.

* * * * *